United States Patent [19]

Miyawaki et al.

[11] Patent Number: 5,402,382
[45] Date of Patent: Mar. 28, 1995

[54] NONVOLATILE SEMICONDUCTOR MEMORY DEVICE CAPABLE OF ERASING BY A WORD LINE UNIT

[75] Inventors: Yoshikazu Miyawaki; Yasushi Terada; Takeshi Nakayama; Shinichi Kobayashi; Tomoshi Futatsuya, all of Hyogo, Japan

[73] Assignee: Mitsubishi Denki Kabushiki Kaisha, Tokyo, Japan

[21] Appl. No.: 942,887

[22] Filed: Sep. 10, 1992

[30] Foreign Application Priority Data

Oct. 4, 1991 [JP] Japan .................................. 3-257598

[51] Int. Cl.⁶ .............................................. G11C 7/00
[52] U.S. Cl. .................................. 365/218; 365/185; 365/189.09; 365/900; 365/23.06
[58] Field of Search ................... 365/218, 185, 189.09, 365/230.06, 900

[56] References Cited

U.S. PATENT DOCUMENTS

| | | | |
|---|---|---|---|
| 4,334,292 | 6/1982 | Kotecha | 365/218 |
| 5,022,000 | 6/1991 | Terasawa et al. | 365/218 |
| 5,034,926 | 7/1991 | Taura et al. | 365/183 |
| 5,040,036 | 8/1991 | Hazani | 365/185 |
| 5,051,953 | 9/1991 | Kitazawa et al. | 365/218 |
| 5,077,691 | 12/1991 | Haddad et al. | 365/218 |
| 5,109,361 | 4/1992 | Yim et al. | 365/218 |
| 5,136,541 | 8/1992 | Arakawa | 365/185 |
| 5,185,718 | 2/1993 | Rinerson et al. | 365/185 |

FOREIGN PATENT DOCUMENTS

| | | | |
|---|---|---|---|
| 2223097 | 9/1990 | Japan | 365/218 |
| 3219496 | 9/1991 | Japan | 365/218 |

OTHER PUBLICATIONS

N. Ajika et al., "A 5 Volt Only 16M Bit Flash EEPROM Cell with a Simple Stacked Gate Structure", published Dec. 9, 1990.

Stiegler et al. "A 4Mb 5V-Only Flash EEPROM with Sector Erase," IEEE 1990 Symposium on VLSI Circuits, pp. 103–104.

*Primary Examiner*—Joseph A. Popek
*Assistant Examiner*—Tan Nguyen
*Attorney, Agent, or Firm*—Lowe, Price LeBlanc & Becker

[57] ABSTRACT

A nonvolatile semiconductor memory device has a plurality of memory cells, which are arranged in a matrix form having rows and columns and each have floating gate for holding an information charge, a plurality of bit lines, a plurality of word lines, a plurality of source lines, and a high voltage generator for generating a negative high voltage. The high voltage generator is connected to each word line and has a capacitor to which a predetermined clock is applied in response to a signal for selecting word lines. The semiconductor memory device further comprises an erasing device, which applies the negative high voltage generated by, the high voltage generator to the word line selected by the selection signal in the erasing operation. The erasing device grounds the source line connected to the source of the corresponding memory cell.

24 Claims, 19 Drawing Sheets

FIG.4

|  | READ | WRITE | ERASE |
|---|---|---|---|
| SELECTED WORD LINE | $V_{cc}$ | $V_{pp}$ | $V_{ee}$ |
| UNSELECTED WORD LINE | 0V | 0V | 0V |

SOURCE LINE IS 0V.

|  | READ | WRITE | ERASE |
|---|---|---|---|
| SELECTED WORD LINE | Vcc | Vpp | Vee |
| UNSELECTED WORD LINE | 0V | 0V | Vcc |
| SOURCE LINE | 0V | 0V | Vcc |

FIG.14

|  | READ | WRITE | ERASE | DISCHARGE AFTER ERASING |
|---|---|---|---|---|
| CLK₁ | L | L | H | H |
| CLK₃ | H | H | L | H |
| CLK₄ | L | L | H | L |

FIG.16

| | READ | WRITE | ERASE | DISCHARGE AFTER ERASING |
|---|---|---|---|---|
| CLK3 | H | H | L | H |
| CLK4 | L | L | H | L |
| CLK5 | L | L | L | H |
| CLK6 | L | L | H | L |

NONVOLATILE SEMICONDUCTOR MEMORY DEVICE CAPABLE OF ERASING BY A WORD LINE UNIT

BACKGROUND OF THE INVENTION

1. Field of the Invention

The present invention relates to semiconductor memory devices, and particularly to electrically writable and erasable nonvolatile semiconductor memory devices (will be called "EEPROMs" hereinafter). More particularly, the invention relates to an erasing technique for a flash memory which is a type of EEPROM.

2. Description of the Background Art

FIG. 20 is a cross section of a memory cell in a flash memory, and FIG. 21 is a block diagram of the conventional flash memory.

With reference to the figures, the memory cell is formed of a memory transistor which has a two-layered gates including a control gate 1 and a floating gate 2.

With reference to FIG. 21, a memory array 5 has memory cells shown in FIG. 20 which are arranged in a row direction and a column direction. Each memory cell has a drain region 3 connected to a bit line 6, a control gate 1 connected to a word line 7, and a source region 4 connected to a source line 17. A gate oxide film located between floating gate 2 and a semiconductor substrate 25 generally has a thickness of about 100 Å. Each word line 7 is connected to an output of a row decoder 9. Each bit line 6 is connected to a Y-gate 8. Each source line 17 is connected to a source line switch 11. Y-gate 8 is controlled by a column decoder 10 to control a connecting state of bit line 6 to a sense amplifier 13 and a write circuit 12. Each of row decoder 9 and column decoder 10 receives an output of an address buffer 15 to select one word line and one set of Y-gates. Write data and read data to and from memory array 5 are externally transmitted through an I/O buffer 16. Control circuit 14 is responsive to an externally applied control signal to control an operation of each circuit block.

Then, an operation of the conventional flash memory will be described below.

The data stored in the memory cells of memory array 5 is erased by a batch processing. In the erasing operation, a high voltage is applied to source regions 4 of all the memory cells by source line switch 11, and control gates 1 are grounded. Thereby, a high electric field is applied to an oxide film between floating gate 2 and source region 4, so that a tunnel current flows, and electron accumulated in floating gate 2 are extracted and removed to source region 4. Thereby, a threshold voltage of the memory transistor viewed from control gate 1 decreases. This state is identical with a state obtained by applying ultraviolet erasing to an electrically programmable read only memory (EPROM) of an ultraviolet erasing type. A writing operation is performed similarly to that for EPROM. Specifically, a high voltage is applied to drain region 3 and control gate 1 of the memory transistor, and source region 4 is grounded. Channel electron which generates at the vicinity of the drain is injected into floating gate 2, and thus the threshold voltage of the memory transistor viewed from control gate 1 increases.

In the reading operation, a predetermined potential is applied to the control gate of the selected memory cell, and the operation is achieved by determining whether or not the current flows through the selected memory transistor. In this operation, a higher potential applied to the bit line increases an amount of the flowing current, which enables easy detection. However, if the applied potential is higher than a predetermined potential, a high electric field is applied to the oxide film located between the floating gate and the drain, so that the electron accumulated in the floating gate escapes. Therefore, the potential applied to the drain must be restricted nearly in a range from 1 V to 2 V. A current sense amplifier is used to detect the current flowing through the memory cell while restricting the drain potential.

Here, the write voltage applied to the control gate is 12 V, and the read voltage is 5 V. The memory array is formed on a p-type semiconductor 25, as shown in FIG. 20, and circuits other than the memory array is formed on p-type semiconductor and n-type semiconductor.

FIG. 22 is a specific circuit diagram of the row decoder which selects one word line in the read/write operation. Row decoder 9 is formed of an NAND gate 24 for receiving an address signal Xi and others, n-channel MOS transistors 18 and 19 having gates for receiving address signals A1 and $\overline{A1}$, p-channel MOS transistors 21 and 22 having sources for receiving a high voltage Vpp or a power supply voltage Vcc, and n-channel transistors 23. Transistors 21-23 form a latch circuit.

Then, an operation will be described below. When all address signals Xi-Xk applied to NAND gate 24 are "H" (logically high), NAND gate 24 is in the selected state to have an output of "L" (logically low). One of signals A1-A4 goes to "H", and the other signals are maintained at "L". In this operation, only the corresponding one of complementary signals $\overline{A1}$-$\overline{A4}$ is "L", and the other signals are "H". It is assumed that signal A2 becomes "H". In this case, signals A1, A3 and A4 become "L", complementary signal $\overline{A2}$ becomes "L", and complementary signals $\overline{A1}$, $\overline{A3}$ and $\overline{A4}$ becomes "H". Thereby, only a node N2 becomes "L", and nodes N1, N3, and N4 become "H", so that a word line WL2 is selected. In the writing operation, since the high voltage is applied to the sources of p-channel MOS transistors 21 and 22, only word line WL2 has a high potential, ann the other word lines have the ground potential. In the reading operation, a supply voltage of 5 V is applied to the sources of p-channel MOS transistors 21 and 22, and only word line WL2 has the potential of 5 V.

As described above, the conventional flash memory is of a chip erasing type, in which the high voltage is applied to the sources and the gates are grounded for performing the chip erasing of the write data of all the memory cells.

In the chip erasing type, however, the data in all the memory cells including valid write portions is erased, so that the writing operation is required again for the valid write portions, which causes inconvenience. Thus, it will become convenient if a specific portion(s) of the memory cells can be independently erased and written.

An EEPROM allowing erasing by a sector unit is disclosed in "4 Mb 5 V-ONLY FLASH EEPROM WITH SECTOR ERASE" (by H. Stiegler et al., 1990 Symposium on VLSI Circuits, pp. 103-104). Decoders disclosed therein are in forms of READ MODE ROW DECODER and PGM/ERASE DECODER. At the time of sector erase, a negative high voltage is applied on a selected word line by the PGM/ERASE DECODER. However, the scale of a high voltage switching circuit shown in FIG. 4 is so large that its sector erase unit is 64 word lines. The high voltage switching circuit is provided outside the memory cell array because of its large scale, so that unnecessary delay can be caused in an erasing operation.

SUMMARY OF THE INVENTION

It is an object of the invention to improve convenience relating to an erasing operation of a nonvolatile semiconductor memory device.

It is another object of the invention to improve a reliability in an erasing operation of a nonvolatile semiconductor memory device.

It is still another object of the invention to improve a durability of a high voltage generating circuit in a nonvolatile semiconductor memory device.

It is yet another object of the invention to prevent a variation of a threshold voltage after an erasing operation in a nonvolatile semiconductor memory device.

A still further object of the invention is to allow high speed sector erasing in a nonvolatile semiconductor memory device.

In order to achieve the above objects, the present invention provides a nonvolatile semiconductor memory device; comprising a plurality of memory cells which are arranged in a matrix form having rows and columns, each including a control gate, a floating gate, a source and a drain, and holding an information charge in the floating gate, a plurality of bit lines, which are provided correspondingly to the rows of the memory cells, and are connected to the drains of the memory cells in the corresponding rows, respectively, a plurality of word lines, which extend in a direction crossing the bit lines, are provided correspondingly to the columns of the memory cells, and are connected to the control gates of the memory cells in the corresponding columns, respectively, a plurality of source lines which are provided correspondingly to the columns of the memory cells, and are connected to the sources of the memory cells in the corresponding columns, respectively, high voltage generating means, which is connected to each word line, has a capacitor to which a predetermined clock is applied in response to a signal for selecting one of the word lines, and generates a negative high voltage and erasing device, which applies the negative high voltage generated by the high voltage generating means to the word line selected by the selection signal in an erasing operation, and grounds the source line connected to the source of the corresponding memory cell.

In the nonvolatile semiconductor memory device thus constructed, the negative high voltage is applied to the selected word line, and the sources of the corresponding memory cells have the ground potential, so that information of only the memory cells connected to the selected word line is erased. Accordingly, the convenience in the erasing operation is improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a table showing conditions of voltages applied to a selected word line and an unselected word line in reading, writing and erasing operations in the first embodiment;

FIG. 14 is a table showing potential conditions of signals shown in FIG. 13 in respective operations;

FIG. 16 is a table showing potential conditions of signals shown in FIG. 15 in respective operations;

DESCRIPTION OF THE PREFERRED EMBODIMENT

Figure 1:
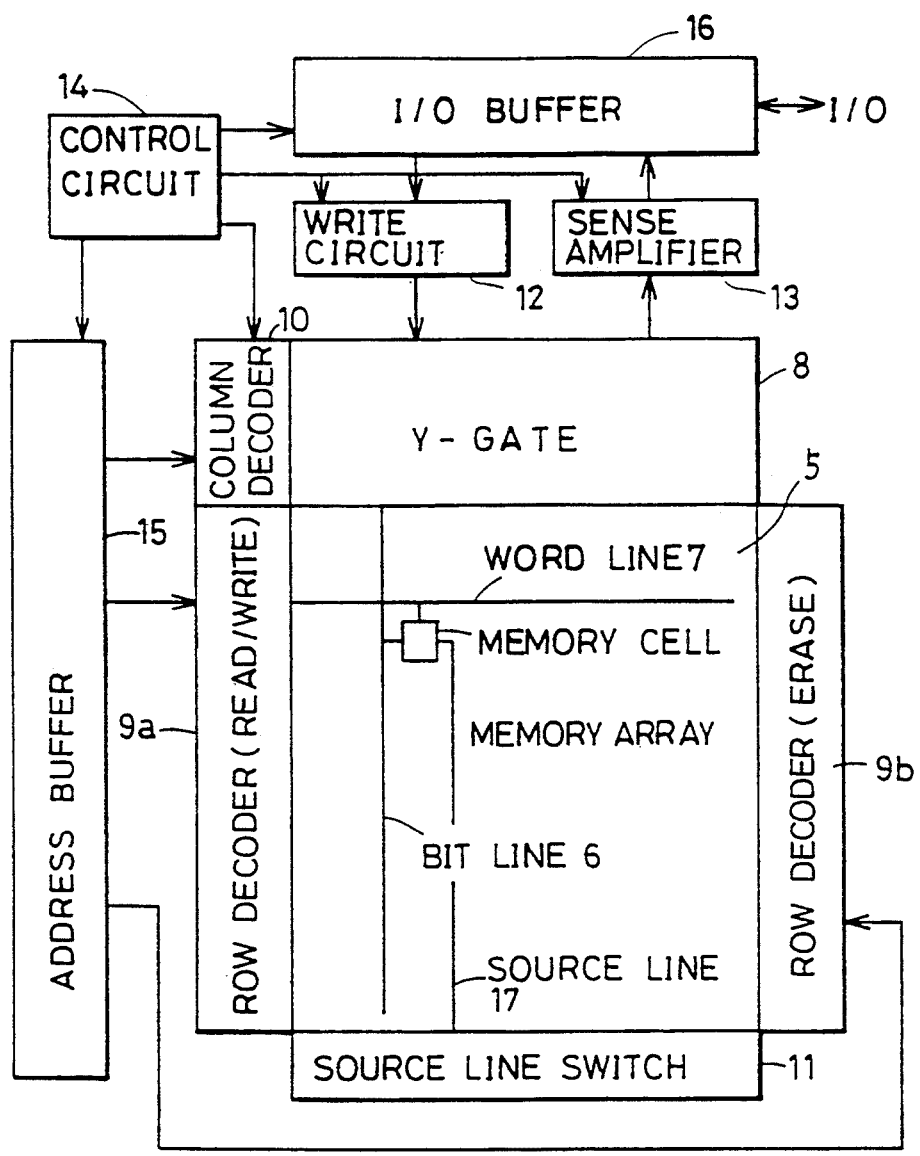
FIG. 1 is a block diagram showing a construction of a flash memory according to a first embodiment of the invention.
Figure 2:
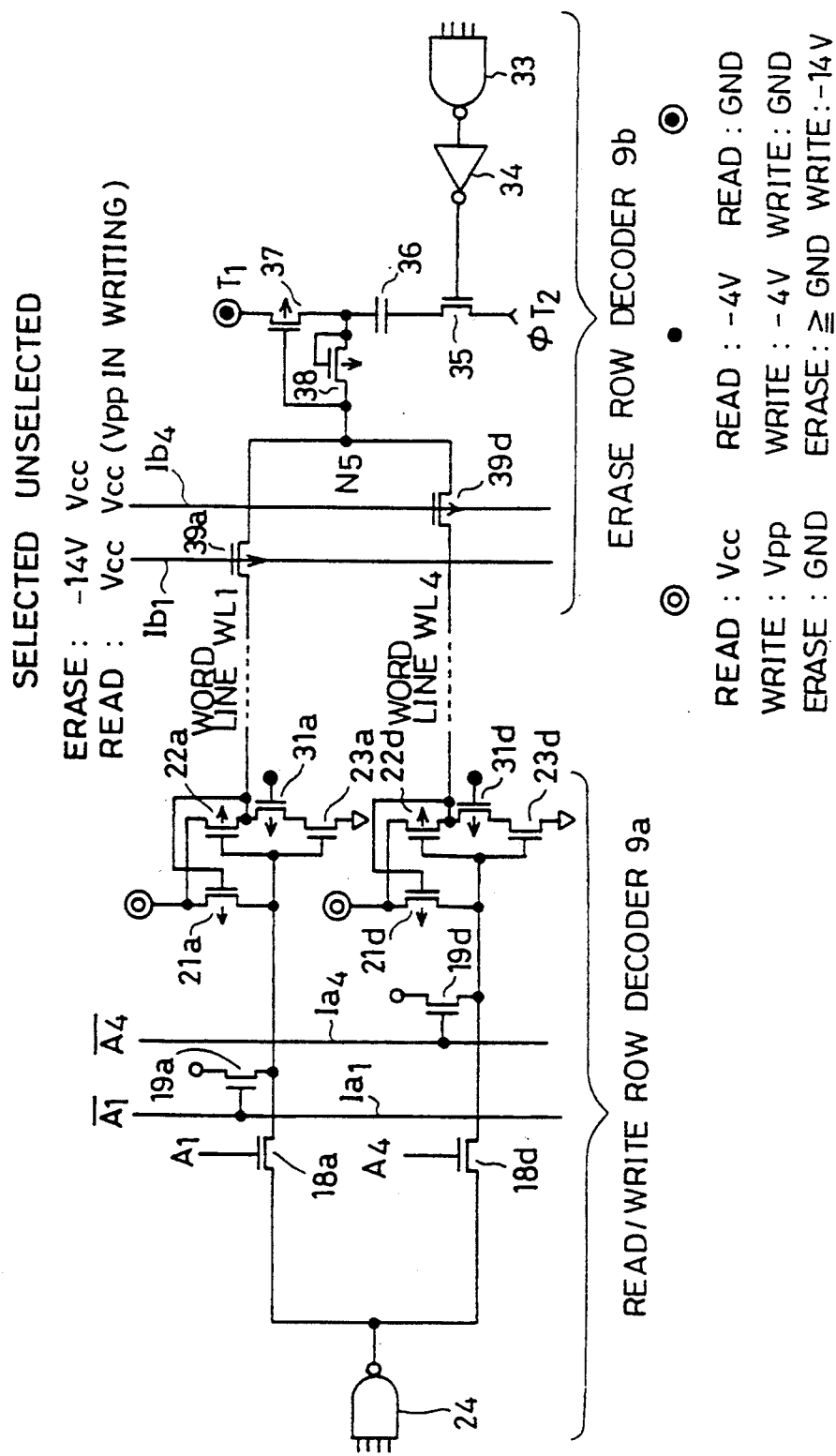
FIG. 2 shows a specific construction of row decoders 9a and 9b shown in FIG. 1.
Figure 3:
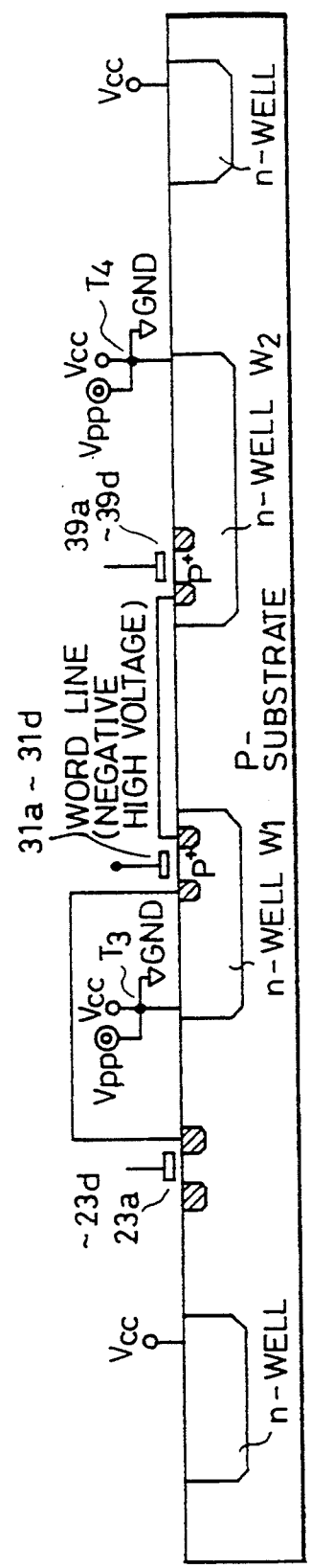
FIG. 3 shows a well construction for a circuit construction in FIG. 2.

A first embodiment of the invention will be described below with reference to figures. FIG. 1 is a block diagram showing a construction of a flash memory according to an embodiment of the invention, and FIG. 2 is a circuit diagram showing a specific construction of row decoders 9a and 9b shown in FIG. 1. FIG. 3 shows a well construction used in a circuit construction in FIG. 2, and FIG. 4 is a table showing voltage application conditions of a selected word line and an unselected word line in reading, writing and erasing operations.

As shown in FIG. 4, the unselected word line and a source line have potentials of 0 V or are in a floating state, and the selected word line has a potential, which is a supply voltage (5 V) in the reading operation, a high voltage (about 10 V) in the writing operation and a negative high voltage (about −14 V) in the erasing operation.

Referring to FIG. 1, the construction of the flash memory of the first embodiment of the invention will be described below.

Figure 21:
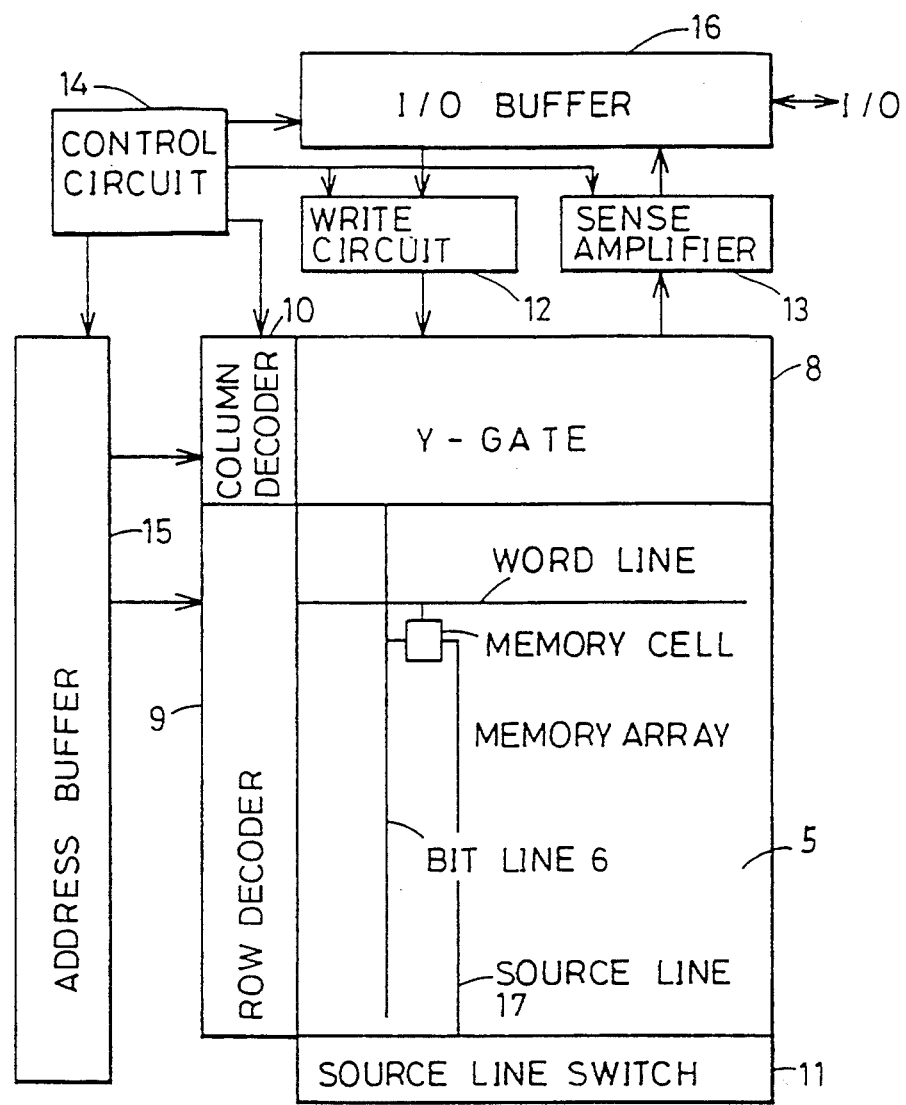
FIG. 21 is a block diagram showing a construction of the conventional flash memory.

The construction in FIG. 1 is different from the prior art construction shown in the block diagram of FIG. 21 in that the construction of the embodiment is provided with a row decoder 9b for an erasing operation, in addition to a row decoder (read/write) 9a corresponding the row decoder in the prior art.

Figure 22:
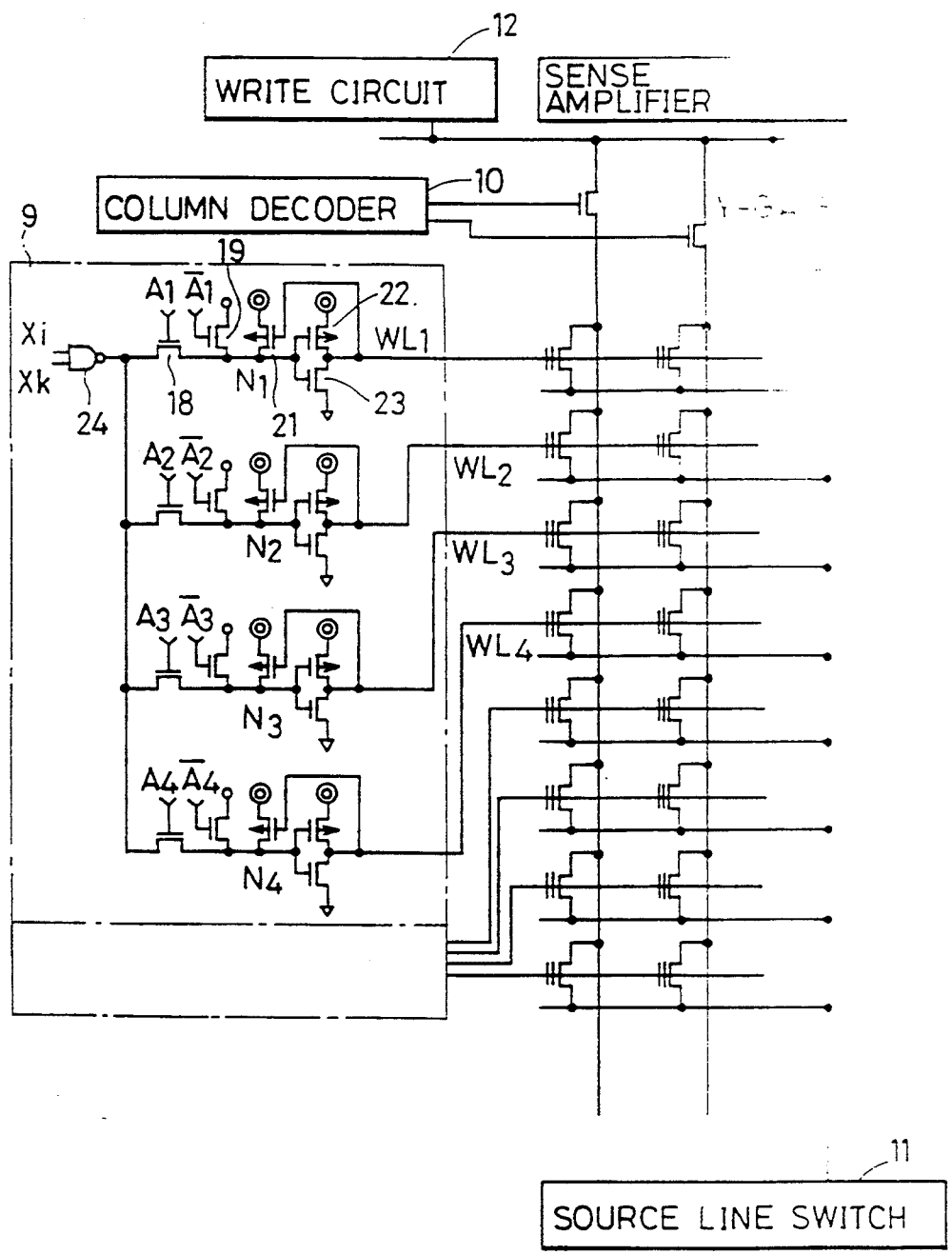
FIG. 22 is a circuit diagram showing a specific construction of a row decoder and a memory array in FIG. 21.

Read/write row decoder 9a shown in FIG. 2 is different from row decoder 9 shown in FIG. 22 in that p-channel transistors 31a–31d are disposed between p-channel channel transistors 22a–22d and n-channel transistors 23a–23d, respectively. The other construction of read/write row decoder 9a is substantially identical with that of the conventional row decoder 9 shown in FIG. 22. Although the circuit construction shown in FIG. 2 corresponds to word lines WL1–WL4, i.e., four word lines, word lines WL1 and WL4 are representatively shown in the figure for illustrating a specific construction. The same circuit construction are provided for word lines WL2 and WL3 which are not shown.

Now, the specific construction of erase row decoder 9b will be described below.

A p-channel transistor 37, a capacitor 36 and an n-channel transistor 35 are connected in series between terminals T1 and T2. The ground potential is applied to terminal T1 in the reading and writing operations, and a negative high voltage (−14 V) is applied thereto in the erasing operation. An output $\phi$ of a ring oscillator is applied to terminal T2 only in the erasing operation. Transistor 35 receives at its gate an output of an NAND gate 33 through an inverter 34. NAND gate 33 receives address signals Xi–Xk, similarly to NAND gate 24. A gate of a p-channel transistor 38 arranged between a node N5 and a connecting point of transistor 37 and capacitor 36 is connected to the connecting point of transistor 37 and capacitor 36. A gate of transistor 37 is connected to node N5. In this embodiment, the word lines from word line WL1 to word line WL4 form one group, in which each word line is connected at one end to one of p-channel transistors 39a–39d and is also connected at the other end to node N5.

Then, an operation will be described below, assuming that word line WL1 is selected. In the reading and writing operations, p-channel transistor 31a receives at its gate the negative voltage to be maintained in the conductive state. P-channel transistors 39a–39d receive at their gates the supply voltage through interconnections Ib1–Ib4 in the reading operations, and receive the high voltage Vpp in the writing operation, respectively, so that word lines WL1–WL4 are isolated from erase row decoder 9b. As described above, read/write decoder 9a operates similarly to the prior art in the reading and writing operations. Thus, erase row decoder 9b is maintained in an inactive state and does not generate a negative voltage in the reading and writing operations.

In the erasing operation of read/write row decoder 9a, for example, signals A1–A4 are "L", complementary signals $\overline{A1}$–$\overline{A4}$ are "H", and all transistors 19a–19d are turned on through interconnections Ia1–Ia4. By turning on all transistors 23a–23d, all word lines WL1–WL4 are grounded. Then, a potential of 0 V or more is applied to the respective gates of p-channel transistors 31a–31d to turn off transistors 31a–31d, so that word lines WL1–WL4 are set at the floating state. In erase row decoder 9b, NAND gate 33 is in the selected state and has the output of "L" when all address signals applied thereto are "H", so that the potential of "H" is applied through inverter 34 to the gate of n-channel transistor 35. The output $\phi$ of the oscillator is applied to the source of transistor 35, i.e., terminal T2, and the negative high voltage (e.g., −14 V) is applied to the source of p-channel transistor 37, i.e., terminal T1. A target to be erased, e.g., p-channel transistor 39a connected to the selected word line WL1 receives at its gate the negative high voltage through interconnection Ib1, and transistors 39b–39d connected to the unselected word lines receive at their gates the voltage of 0 V or more. Thus, only p-channel transistor 39a connected to selected word line WL1 becomes conductive.

In this manner, selected word line WL1 is conducted to erase row decoder 9b. The negative voltage generating circuit formed of p-channel transistors 37 and 38 as well as capacitor 36, which are arranged correspondingly to the selected word line, is activated, and the negative high voltage is applied to selected word line WL1 through node N5 and conductive p-channel transistor 39a. Meanwhile, unselected word lines WL2–WL4 are maintained at 0 V.

FIG. 4 shows voltage application conditions in the reading, writing and erasing operations of the selected word line and unselected word lines described above. As shown in FIG. 3, p-channel transistors 31a–31d and 39a–39d of which gates receive the negative voltage are provided with n-wells W1 and W2, independently from the circuits of 5 V system provided for them. Through terminals T3 and T4, these wells receive supply voltage Vcc in the reading operation, high voltage Vpp in the writing operation, and 0 V in the erasing operation.

The first embodiment has the above described construction in which the negative high voltage is applied to the control gate of the selected memory transistor, and the source and p-type semiconductor substrate are grounded for performing the erasing operation. As compared with the prior art in which the high voltage is applied to the source, the electric field in the oxide film is weakened, which suppresses the erasing. The reason is as follows. Since the potential of the floating gate is determined by the capacity-coupling with the other node, the capacity of the source and the floating gate decreases to an ignorable extent when the high voltage is applied to the source line, so that it is possible to ignore the increase of the potential of the floating gate which is caused by the application of the high voltage to the source thereof. Consequently, a high field is generated in the oxide film between the floating gate and the source. However, when the source is grounded and the negative high voltage is applied to the control gate, the potential of the floating gate does not decrease to a large extent, because the capacity between the floating gate and the semiconductor substrate is large. Therefore the field in the oxide film between the floating gate and the semiconductor substrate is weakened. In view of the above matters, the first embodiment is improved into a second embodiment.

Figure 5:
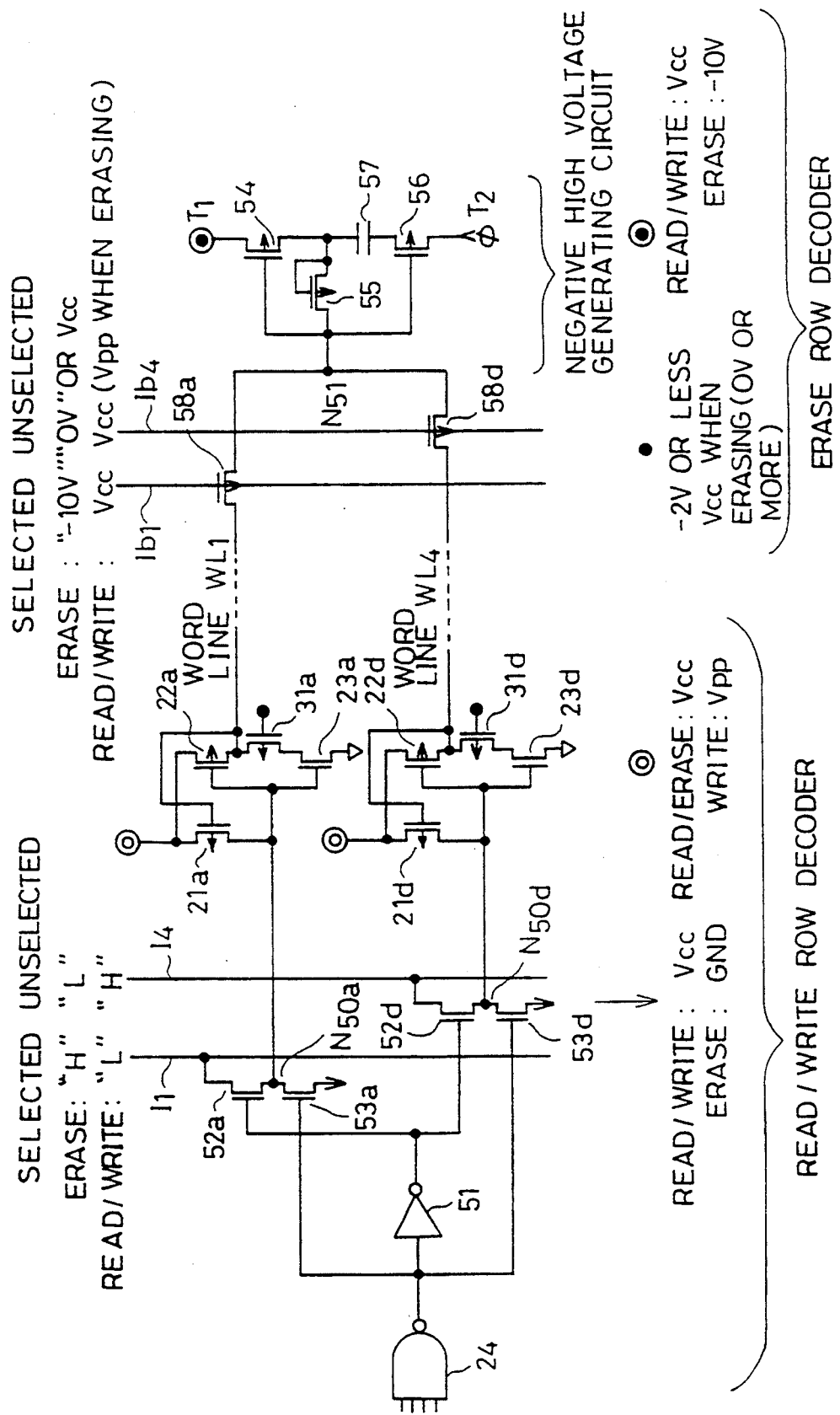
FIG. 5 is a circuit diagram showing a specific construction of a write/read row decoder 9a and an erase row decoder 9b of a second embodiment of the invention.

The second embodiment of the invention will be described below with reference to figures. FIG. 5 shows a specific construction of row decoders 9a and 9b of the second embodiment of the invention. Also in this embodiment, the specific construction is shown with respect to word lines WL1 and WL4. Word lines WL2 and WL3 have a similar construction to the first embodiment. This embodiment is different from the first embodiment in that an inverter 51 as well as n-channel transistors 52a–52d and 53a–53d are employed, and connecting points of transistors 52a–52d and 53a–53d are connected to latch circuits, which are respectively formed of p-channel transistors 21a–21d, 22a–22d and 31a–31d, and n-channel transistors 23a–23d, similarly to the first embodiment, respectively. There is also such a difference in that a gate of p-channel transistor 56 connected to one terminal T2 of the negative high voltage generating circuit is connected to a node N51. Specifically, gates of transistors 53a–53d among transistors 52a–52d and 53a–53d, which are connected in series, and inverter 51 are connected to the output side of NAND gate 24. The output side of inverter 51 is connected to the gates of transistors 52a–52d. A predetermined potential (i.e., potential of "L" in the reading/writing operations, and potential of "H" in the erasing operation) is applied to either the source or drain of each of transistors 52a–52d through interconnections I1–I4. NAND gate 24 and inverter 51 are provided for each group of four word lines WL1–WL4 in this embodiment. Driver circuits, which are respectively formed of, e.g., transistors 52a–52d and 53a–53d as well as transistors 21a–21d and 22a–22d, are provided for the word lines, respectively.

Then, an operation of this embodiment will be described below. An output of NAND gate 24 is selected and goes to "L" when all the applied address signals are "H". In this time, inverter 51 has an output of "H". Selection of one of four word lines WL1–WL4 is carried out by one of transistors 52a and 53a—transistors 52d and 53d corresponding to the word line. For example, when word line WL1 is selected in the reading and writing operations, the potential of "L" is applied to a drain of transistor 52a through interconnection I1, and the potential of "H", i.e., an output of inverter 51 is applied to a gate of transistor 52a, so that a node N50a has a potential of "L". In this manner, supply potential Vcc (in the reading operation) or high potential Vpp (in the writing operation) is applied only to selected word line WL1. Since the potential of "H" is applied to the drains of transistors 52 of the unselected word lines, and the potential of "H" is applied to the gates of the transistors 52, node N50 is at the "H" level. Therefore, the other word lines, i.e., unselected word lines have the ground potential. Supply potential Vcc is applied to the gates of all transistors 58a–58d to turn off transistors 58a–58d, so that word lines WL1–WL4 are isolated from erase row decoder 9b. The negative voltage is applied to the respective gates of p-channel transistors 31a–31d for grounding the unselected word lines in the writing and reading operations. This negative voltage may be steadily generated (e.g., by a substrate voltage generating circuit of a DRAM), or may be generated, using an address transition detector (ATD).

Figures 6, 7:
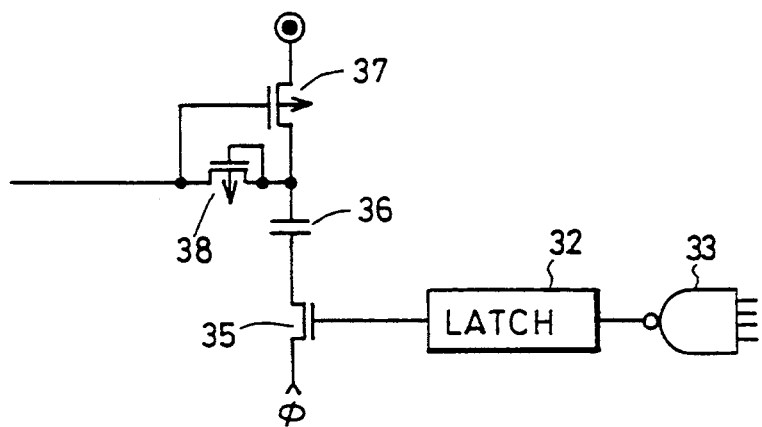
FIG. 6 shows voltage application conditions of a selected word line, an unselected word line and a source line in respective operations in the second embodiment.
FIG. 7 is a circuit diagram showing a specific construction of an erase row decoder of a third embodiment of the invention.

In the erasing operation, the voltages applied to transistors 52a–52d and 53a–53d are inverted. Specifically, the output of NAND gate 24 is "L", and the output of inverter 51 is "H", so that only node N50a corresponding to selected word line WL1 becomes "H". Thereby, selected word line WL1 has the ground potential, and unselected word lines WL2–WL4 have the supply potential Vcc. Thereafter, the potential applied to the gate of transistor 31a is increased to 0 V or more to set selected word line WL1 at the floating state. The gate of p-channel transistor 58a connected to selected word line WL1 receives the negative high voltage of, e.g., −10 V through interconnection Ib1, and the other p-channel transistors 58b–58d receive at their gates the voltage of 0 V or Vcc through interconnections Ib-2–Ib4, respectively. Thereby, node N51 has the ground potential, and 0 V is applied only to the gate of p-channel transistor 56 of the negative high voltage generating circuit connected to selected word line WL1. 0 V is not applied to the gates of the transistors corresponding to the other negative high voltage generating circuits (not shown). Transistor 56 becomes conductive, and the supply potential Vcc is applied to the gates of the transistors 56 corresponding to the other high voltage generating circuits (not shown) to maintain the same in the nonconductive state. Thereafter, the output signal ϕ of the oscillator is applied to terminal T2, the negative high voltage generating circuit connected to the selected word line is activated by the boost effect, and node N51 goes to, e.g., −10 V. Thereby, only selected word line WL1 receives the negative high voltage of, e.g., −9 V (because of the voltage decrease generated correspondingly to the threshold voltage of transistor 58a), and unselected word lines WL2–WL4 are maintained in supply potential Vcc. At the same time, supply potential Vcc is applied to the source line to erase the information stored in the memory cells connected to selected word line WL1. FIG. 6 shows voltage application conditions of the selected word line, unselected word line and source line in the reading, writing and erasing operations described above, respectively.

Then, a third embodiment of the invention will be described below. This embodiment is directed to allow variation of a sector size (i.e., a range of the memory cells to which the chip erasing is applied).

As shown in FIG. 7, a latch circuit 32 is connected between the gate of transistor 35 forming the erase decoder and NAND gate 33. The output of NAND gate 33 is latched with respect to the word line to be erased, so that transistor 35 is turned on. Therefore, a plurality of word lines can be arbitrarily selected in the erasing operation, and consequently, the sector size can be varied.

A fourth embodiment of the invention will be described below.

This embodiment is particularly directed to the negative high voltage switch, in which the electric field applied to the oxide film forming the capacitor which forms the erase decoder is weakened to improve the reliability.

Figure 8:
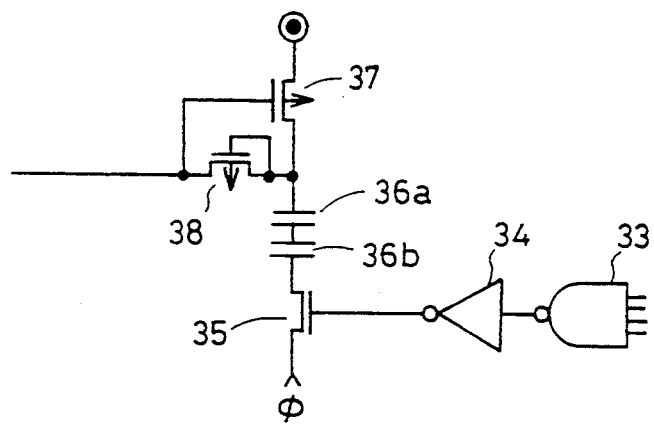
FIG. 8 is a circuit diagram showing a specific construction of an erase row decoder of a fourth embodiment of the invention.
Figure 9:
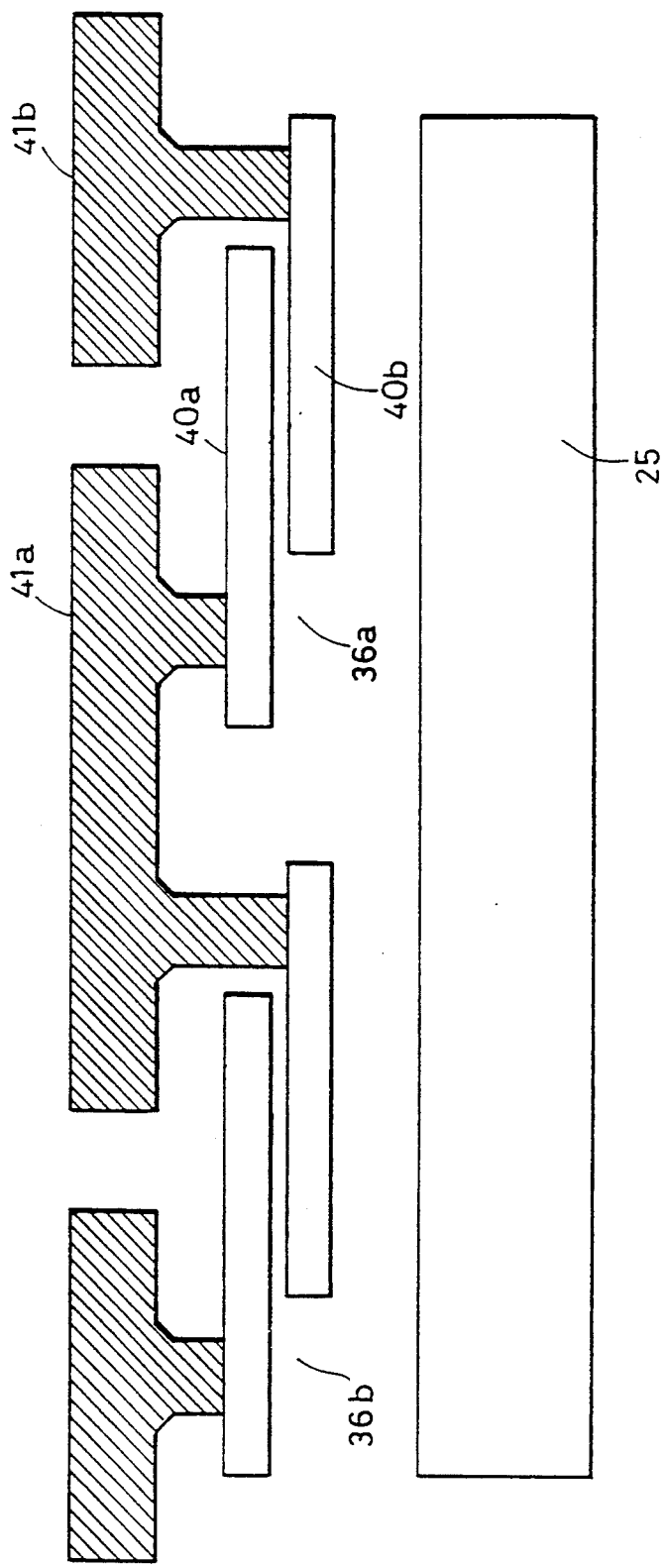
FIG. 9 shows a specific cross section of capacities 36a and 36b shown in FIG. 8.

As shown in FIG. 8, capacitors 36a and 36b are connected in series between transistors 37 and 35. Further, capacitor 36a has a construction shown in FIG. 9, in which polysilicon, which forms the control gate of the memory transistor, forms an upper conductor 40a, and polysilicon, which forms the floating gate of the memory transistor, forms a lower conductor 40b. Conductors forming capacitor 36b have similar structures. According to this construction, capacitors 36a and 36b are simultaneously formed in the step for forming the floating gate and the control gate. Therefore, the process can be simple, and the capacitors having the high reliability can be formed. Also, as shown in the figure, interconnection layers 41a and 41b having T-shaped cross sections facilitate the connection of capacitors in series. This weakens the electric field applied to each capacitor, so that the pressure proof performance of the capacitors is improved as a whole.

Figure 10:
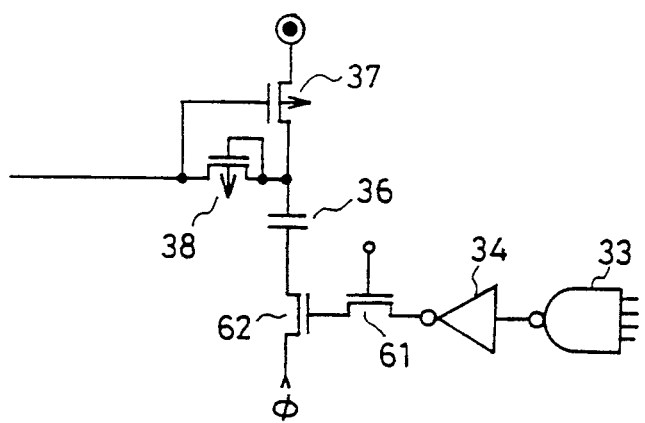
FIG. 10 is a circuit diagram showing a specific construction of an erase row decoder of a fifth embodiment of the invention.

A fifth embodiment of the invention will be described below. In this embodiment, the potential applied to the capacitors, which form the negative high voltage generating circuit, can be varied in a range from 0 V to Vcc. In the former embodiments, the potential applied to capacitors 36 (36a and 36b) is reduced by an amount corresponding to the threshold voltage of n-channel transistor 35 with respect to the potential applied to terminal T2. Therefore, the output of inverter 34 is applied to a gate of a transistor 62 through an n-channel transistor 61 having a gate receiving Vcc, as shown in FIG. 10. When signal φ goes to Vcc, the voltage of the gate of transistor 62 increases owing to the capacitor-coupling. Consequently, the potential Vcc of signal φ is applied to capacitor 36 as it is, without the reduction of the potential of transistor 35 by an amount corresponding to the threshold, which is caused in the former embodiments.

A sixth embodiment of the invention will be described below. This embodiment is not provided with the negative high voltage generating circuit. In this embodiment, the negative high voltage is applied to the selected word line, and supply potential Vcc is applied to the unselected word line.

Figure 11:
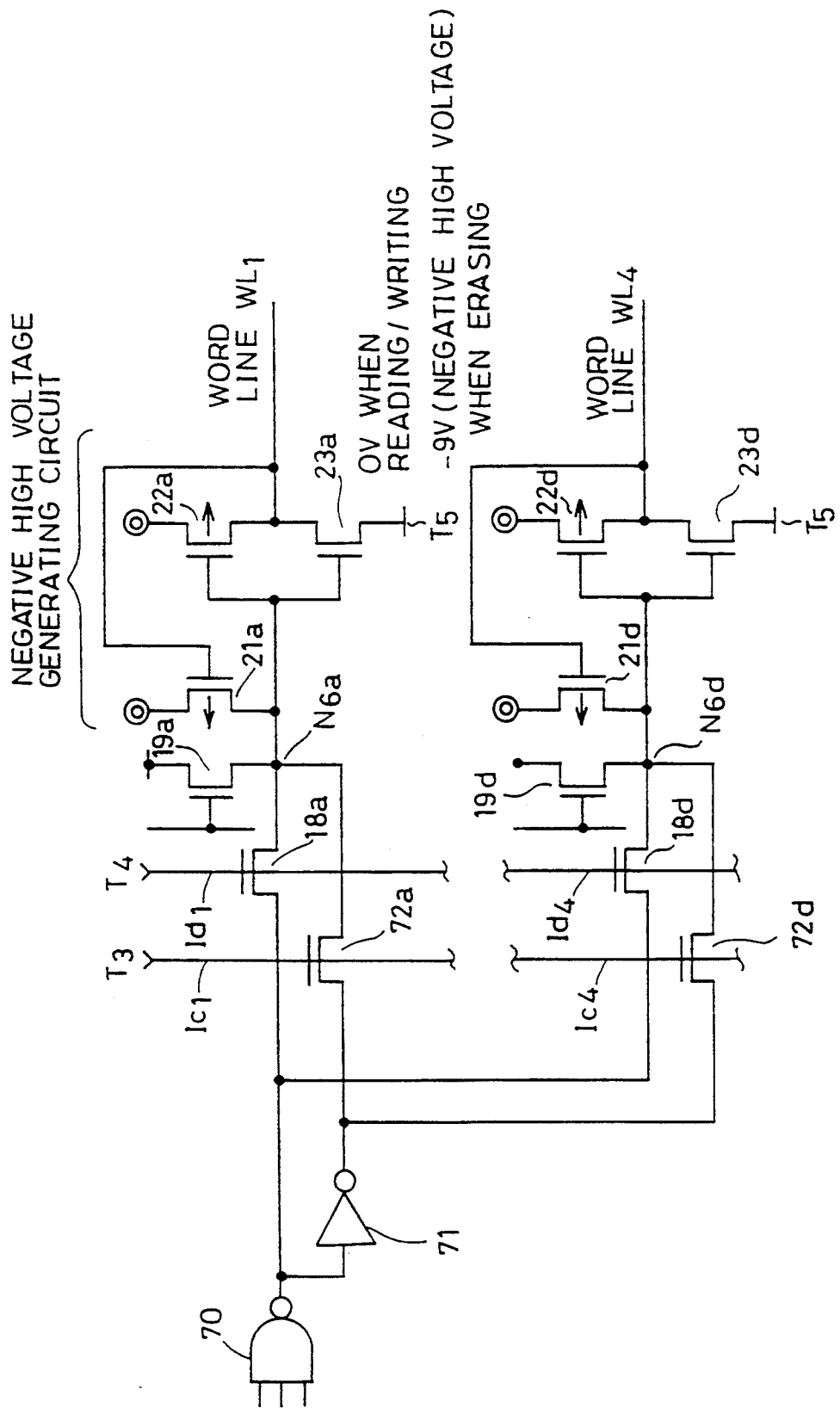
FIG. 11 is a circuit diagram showing a specific construction of an erase row decoder of a sixth embodiment of the invention.
Figure 12:
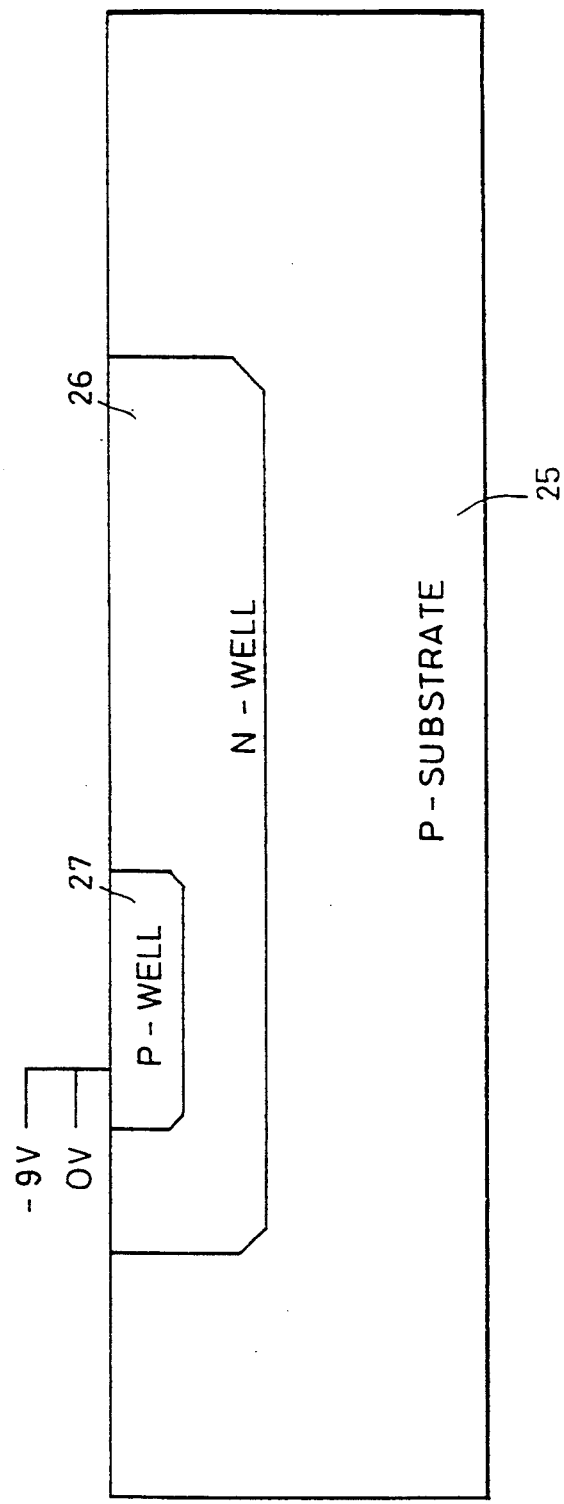
FIG. 12 shows a well construction for achieving a circuit construction in FIG. 11.

FIG. 11 is a specific circuit diagram showing the sixth embodiment, and FIG. 12 shows a well construction thereof. Although FIG. 11 shows only a specific circuit construction for word lines WL1 and WL4, a similar construction exists for word lines WL2 and WL3. The circuit construction in FIG. 11 has following difference with respect to the first embodiment shown in FIG. 2.

An output side of an NAND gate 70 is connected through transistors 18a–18d to nodes N6a–N6d, respectively, and is also connected through an inverter 71 and transistors 72a–72d to nodes N6a–N6d, respectively. This invention does not employ transistors 22a–22d and p-channel transistors 31a–31d which are employed in the former embodiments. Transistors 18a–18d and transistors 72a–72d receive "L" at their respective gates when the word lines are unselected. Meanwhile, when the corresponding word line is selected, the applied potential is varied to switch them in the erasing operation and in the reading/writing operations. For example, when word line WL1 is selected, the high potential "H" is applied to a terminal T4, which is connected to the gate of transistor 18a through interconnection Id1, in the reading/writing operations. When word line WL1 is selected in the erasing operation, the high potential "H" is applied to a terminal T3, which is connected to the gate of transistor 72a through interconnection Ic1. 0 V is applied to a terminal T5, which is connected to n-channel transistor 23a forming the negative high voltage generating circuit, in the reading/writing operations, and −9 V (negative high voltage) is applied thereto in the erasing operation. In this construction, when a word line, e.g., word line WL1 is selected in the erasing operation, transistor 72a is turned on and node N6a goes to the "H" level. Thus, transistor 23a is turned on, and the negative high voltage applied to terminal T5 is applied to word line WL1. In the reading and writing operations., a path at the output side of inverter 71 is not used, and node N6a goes to the "L" level owing to the turn-on of transistor 18a. According to an operation similar to that of decoder 9 shown in FIG. 22, an intended word line is selected, and the predetermined potential is applied through transistor 22a.

The n-channel transistor shown in FIG. 11 is provided in a p-well 27 which is provided in an n-well 26, as shown in FIG. 12, and applies the negative high voltage (−9 V) to p-well 27, NAND gate 70, inverter 71 and the source of the n-channel transistor forming the negative high voltage generating circuit in the erasing operation. Accordingly, Vcc is applied to the unselected word lines, and the negative high voltage (e.g., −9 V) is applied to the selected word line in the erasing operation. In this manner, the information stored in the memory cells connected to the intended word line can be erased without employing an independent negative high voltage circuit.

Seventh and eighth embodiments of the invention will be described below.

According to the method, in which the negative high voltage is applied to the selected word line and the positive voltage is applied to the unselected word line and source for the erasing operation, the memory cells in the erased state on the same bit line are turned on and also the bit line is charged. When source line is grounded after the application of the erase pulse, the charge of the charged bit line is discharged through the memory transistors. This discharge generates hot electron, which may cause an incorrect writing operation. These embodiments are directed to solve this problem.

Figure 13:
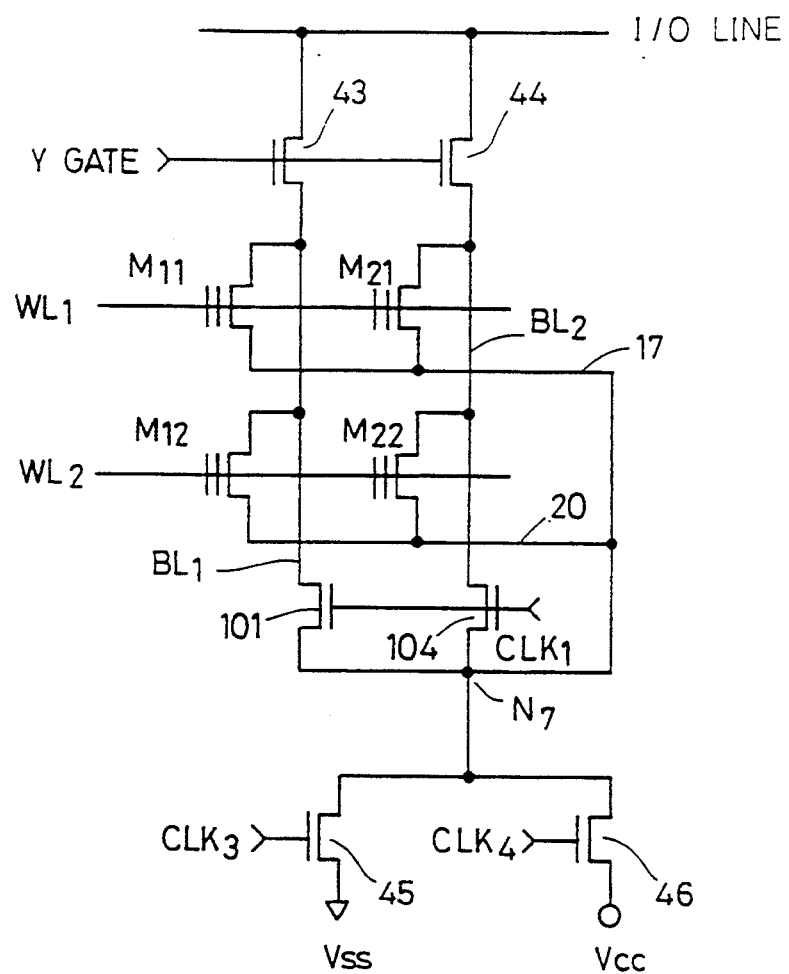
FIG. 13 is a circuit diagram showing a bit line construction of a seventh embodiment of the invention.

FIG. 13 is a circuit diagram showing the seventh embodiment, and specifically a part (two columns and 2 rows) of the memory cell array in FIG. 1.

As shown in the figure, bit lines BL1 and BL2 are connected through p-channel transistors 101 and 104 to node N7 to which source lines 17 and 20 are connected, respectively. Transistors 101 and 104 have gates for receiving a signal CLK1. A connection node N7 of bit lines BL1 and BL2 as well as source lines 17 and 20 is branched. One branched portion is connected to a ground potential Vss through a transistor 45, and the other portion is connected to supply potential Vcc through a transistor 46. Transistor 45 has a gate for receiving a signal CLK3, and transistor 46 has a gate for receiving a signal CLK4. FIG. 14 is a table showing voltage application conditions of signals CLK1, CLK3 and CLK4 in the seventh embodiment.

In this manner, by setting CLK1 at "H" in the erasing cycle (in which the erasing pulse is applied, and the discharging is performed after the erasing), bit lines BL1 and BL2 can have the same potential as the source lines 17 and 20, i.e., the ground potential.

Figure 15:
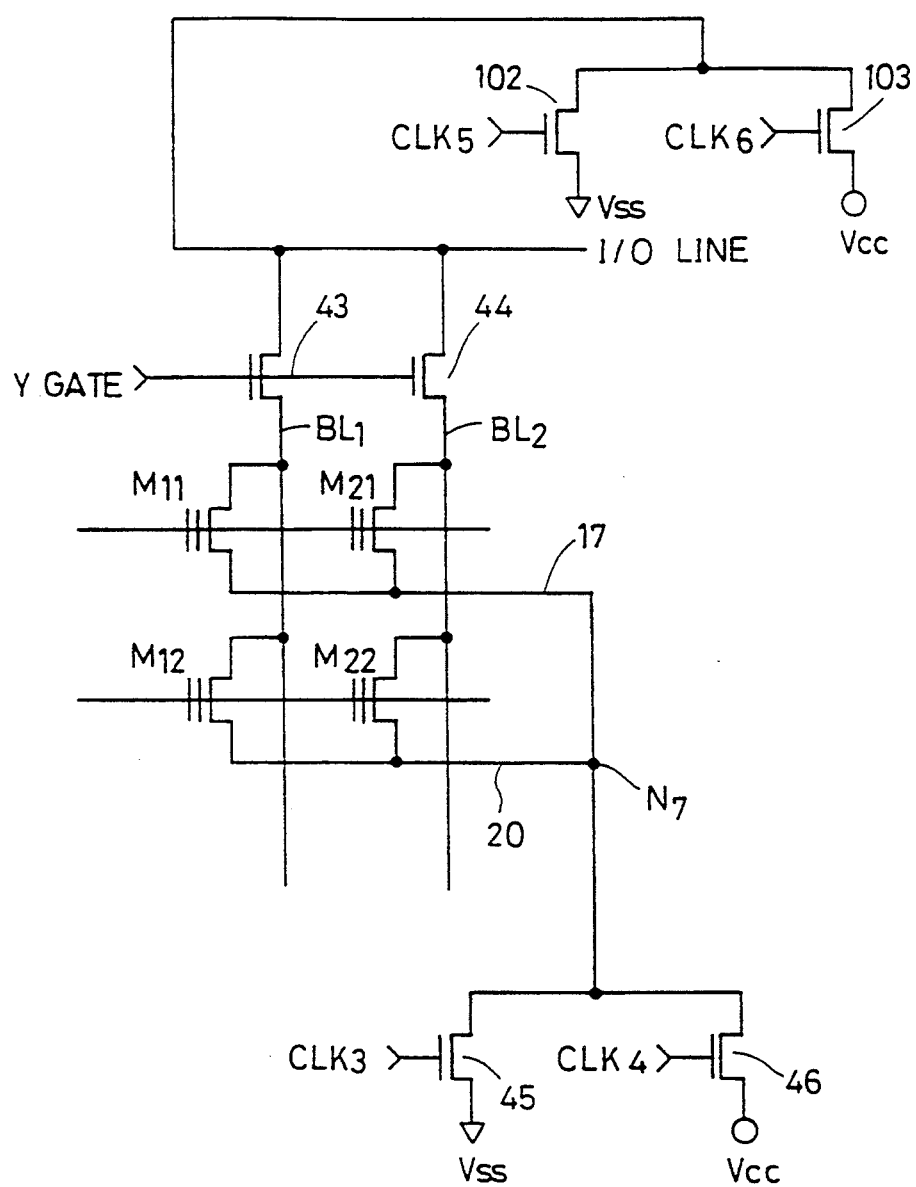
FIG. 15 is a circuit diagram showing a bit line construction of an eighth embodiment of the invention.

FIG. 15 is a circuit diagram showing the eighth embodiment, and specifically a part (two columns and 2 rows) of the memory cell array in FIG. 1.

In the figure, bit lines BL1 and BL2 are connected to an I/O line through transistors 43 and 44 to which a signal of a Y-gate is applied. I/O line has a branched terminal, one of which is connected through a transistor 102 to ground potential Vss, and the other of which is connected through a transistor 103 to supply potential Vcc. Transistor 102 has a gate for receiving a signal CLK5, and a transistor 103 has a gate for receiving a signal CLK6. A connection node N7 of sources 17 and 20 is branched. One branched portion is connected through transistor 45 to ground potential Vss, and the other branched portion is connected through transistor 46 to supply potential Vcc. Transistor 45 has a gate for receiving signal CLK3, and transistor 46 has a gate for receiving signal CLK4. FIG. 16 is a table showing voltage application conditions of signals CLK3–CLK6 in the reading, writing and erasing operations and in the discharging operation after the erasing operation in the eighth embodiment.

In this construction, the voltage equal to that applied to source lines 17 and 20 can be applied to I/O line, i.e., bit lines BL1 and BL2 in the erasing cycle. Naturally, transistor 103 may be formed of a p-channel transistor, in which case the logic of signal CLK6 applied thereto is inverted.

Ninth and tenth embodiments of the invention will be described below.

Figure 17:
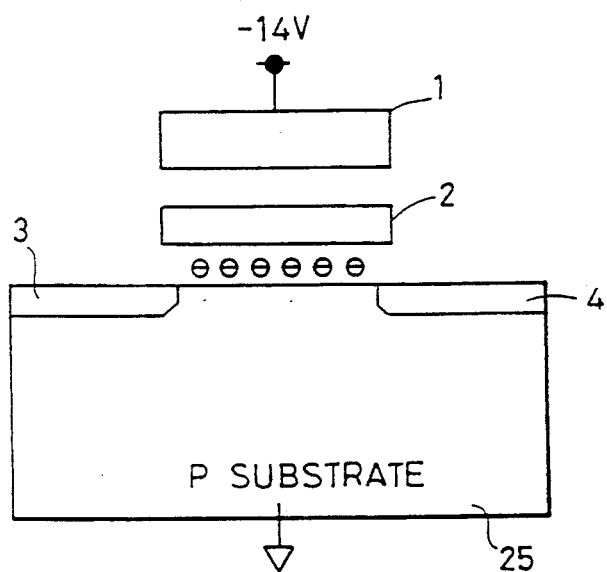
FIG. 17 is a cross section of a construction of a memory cell for showing an object to be achieved by ninth and tenth embodiments of the invention.

In the method, in which the negative high voltage is applied to the selected word line, the p-type semiconductor substrate is grounded, and drain and source are grounded or floated for the erasing operation, an electric field is substantially uniformly induced in the gate oxide film between the floating gate and the semiconductor substrate, and the tunnel of electrons is generated substantially through a whole channel surface. In this condition, since the electron is trapped in the gate oxide film formed between floating gate 2 and semiconductor substrate 25, as shown in FIG. 17, the discharge of the trapped electron after the erasing operation may shift the threshold voltage of the memory transistor. Ninth and tenth embodiments are directed to overcome this problem.

Figure 18:
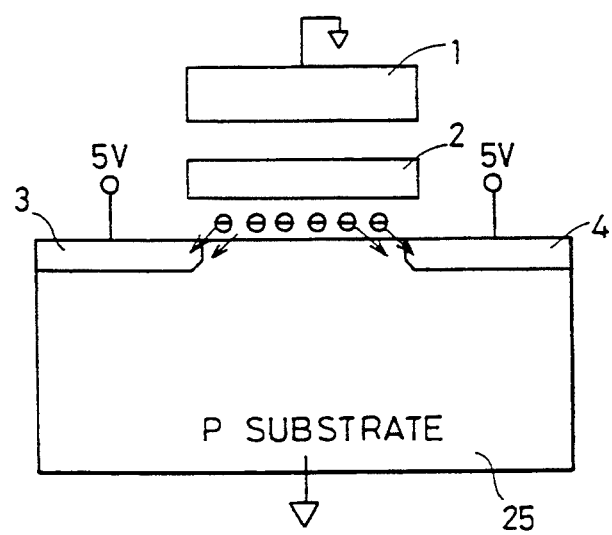
FIG. 18 is a cross section of a memory cell construction of the ninth embodiment of the invention.

FIG. 18 is a cross section of a memory cell construction for showing the ninth embodiment of the invention.

As shown in the figure, the supply potential (5 V) is applied to drain region 3 and source region 4 of the memory cell after the application of the erasing pulse so as to extract or remove the electron trapped in the oxide film to the source region or drain region.

Figure 19:
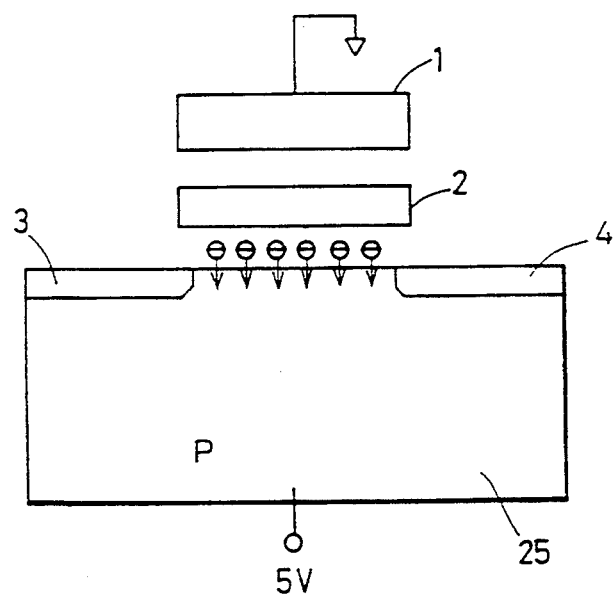
FIG. 19 is a cross section of a memory cell construction of the tenth embodiment of the invention.
Figure 20:
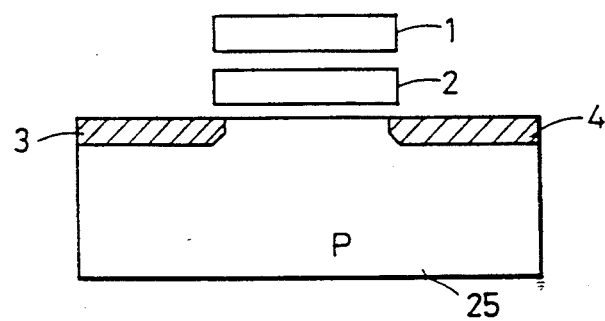
FIG. 20 is a cross section showing a memory cell construction of a conventional flash memory.

FIG. 19 is a cross section of a memory cell construction for showing the tenth embodiment of the invention.

As shown in the figure, the supply potential (5 V) is applied to p-type semiconductor substrate 25 or a p-well (not shown) in which the memory cell is formed, after the application of the erasing pulse so as to extract the electron trapped in the oxide film between floating gate 2 and semiconductor substrate 25 to semiconductor substrate 25 or the p-well.

According to the ninth and tenth embodiments, the electron which has been trapped in the oxide film is discharged after the application of the erase pulse, the threshold value of the memory transistor does not vary after the erasing operation, resulting in the stable erasing operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:
   a plurality of memory cells, which are arranged in a matrix form having rows and columns, each including a control gate, a floating gate, a source and a drain, and holding an information charge in said floating gate;
   a plurality of bit lines each of which correspond to a column of said memory cells, and connect to the drains of said memory cells in the corresponding column;
   a plurality of word lines which extend in a direction crossing said bit lines, each of said plurality of word lines correspond to a row of said memory cells, and connect to the control gates of said memory cells in the corresponding row;
   a plurality of source lines each of which correspond to a row of said memory cells, and connect to the sources of said memory cells in the corresponding row;
   high voltage generating means which is connected to each of said word lines, has a capacitor to which a predetermined clock is applied in response to a signal for selecting one of said word lines, and generates a negative high voltage; and
   erasing means which applies said negative high voltage generated by said high voltage generating means to the word line selected by said selection signal in an erasing operation, and grounds the source line connected to the source of the corresponding memory cell.

2. A nonvolatile semiconductor memory device according to claim 1, wherein
   said high voltage generating means includes:
   a first terminal to which a negative high voltage is applied, and a second terminal to which said predetermined clock is applied;
   said capacitor is arranged between said first terminal and said second terminal;
   said semiconductor memory device further comprises:
   a first p-channel transistor arranged between said first terminal and said capacitor;
   an n-channel transistor arranged between said capacitor and said second terminal; and
   a second p-channel transistor arranged between a first connecting point located at a side of said word line and a connecting point formed between said first terminal and said capacitor; wherein
   said first n-channel transistor has a gate connected to said first connecting point, said second n-channel transistor has a gate connected to said second connecting point, and said n-channel transistor has a gate for receiving said selection signal.

3. A nonvolatile semiconductor memory device according to claim 2, wherein said selection signal is formed of an output of an NAND gate supplied through an inverter.

4. A nonvolatile semiconductor memory device according to claim 1, wherein said erasing means includes a latch circuit, to which said selection signal is applied, and applies the negative high voltage to the predetermined word line in accordance with contents of setting of said latch circuit.

5. A nonvolatile semiconductor memory device according to claim 1, wherein said capacitor is formed of a plurality of capacitors connected in series.

6. A nonvolatile semiconductor memory device according to claim 5, wherein an upper conductor forming said capacitor is formed in a step for forming said control gate, and a lower conductor for forming said capacity is formed in a step for forming said floating gate.

7. A nonvolatile semiconductor memory device according to claim 1, wherein a p-channel transistor is arranged between said capacity and a terminal to which said clock is applied, and said p-channel transistor receives at its gate said selection signal through an n-channel transistor having a gate connected to said supply voltage.

8. A nonvolatile semiconductor memory device comprising:
- a plurality of memory cells, which are arranged in a matrix form having rows and columns, each including a control gate, a floating gate, a source and a drain, and holding an information charge in said floating gate;
- a plurality of bit lines each of which correspond to a column of said memory cells, and connect to the drains of said memory cells in the corresponding column;
- a plurality of word lines which extend in a direction crossing said bit lines, each of said plurality of word lines correspond to a row of said memory cells, and connect to the control gates of said memory cells in the corresponding row;
- a plurality of source lines each of which correspond to a row of said memory cells, and connect to the sources of said memory cells in the corresponding row;
- high voltage generating means which is connected to each of said word lines, has a capacitor to which a predetermined clock is applied in response to a signal for selecting one of said word lines, and generates a negative high voltage; and
- erasing means which applies the negative high voltage generated by said high voltage generating means to the word line selected by said selection signal in an erasing operation, and applies a positive voltage to said source line connected to the source of the corresponding memory cell.

9. A nonvolatile semiconductor memory device comprising:
- a plurality of memory cells, which are arranged in a matrix form having rows and columns, each including a control gate, a floating gate, a source and a drain, and holding an information charge in said floating gate;
- a plurality of bit lines each of which correspond to a column of said memory cells, and connect to the drains of said memory cells in the corresponding column;
- a plurality of word lines which extend in a direction crossing said bit lines, each of said plurality of word lines correspond to a row of said memory cells, and connect to the control gates of said memory cells in the corresponding row;
- a plurality of source lines each of which correspond to a row of said memory cells, and connect to the sources of said memory cells in the corresponding row;
- a plurality of row decoder means each provided corresponding to each of said word lines for generating a signal of an L level at the time of reading/writing in response to a signal for selecting one of said word lines, and for generating a signal of an H level at the time of erasing in response to a signal for selecting one of said word lines; and
- a plurality of high voltage providing means each provided between each of said row decoding means and each of said word lines, comprising first and second transistors of a first conductivity type connected together in series, and a third transistor of a second conductivity type, said third transistor connected in series with said first and second transistors, a corresponding one of said word lines being connected to a connecting part therefor, the gates of said first and second transistors each being provided with an output signal of said row decoding means, a power supply potential provided to the opposite side of said connecting part of said first transistor, a ground voltage provided to the opposite side of said connecting part of said second transistor, and a negative voltage is applied to the gate of said third transistor.

10. A nonvolatile semiconductor memory device comprising:
- a plurality of memory cells which are arranged in a matrix form having rows and columns, each including a control gate, a floating gate, a source and a drain, and holding an information charge in said floating gate;
- a plurality of bit lines each of which correspond to a column of said memory cells, and connect to the drains of said memory cells in the corresponding column;
- a plurality of word lines which extend in a direction crossing said bit lines, each of said plurality of word lines correspond to a row of said memory cells, and connect to the control gates of said memory cells in the corresponding row;
- a plurality of source lines each of which correspond to a row of said memory cells, and connect to the sources of said memory cells in the corresponding row;
- erasing means which applies a negative high voltage to a selected word line in an erasing operation, applies a positive voltage to the source of the corresponding memory cell, and applies a positive voltage to an unselected word lines; and
- grounding means which simultaneously grounds said bit lines and said source lines after completion of said erasing operation by said erasing means.

11. A nonvolatile semiconductor memory device according to claim 10, wherein ends of said bit lines are connected to ends of said source lines through a connecting portion, to which a ground potential is applied through a transistor.

12. A nonvolatile semiconductor memory device according to claim 10, wherein ends of said bit line are connected to an input/output line, to which a ground potential is applied through a transistor.

13. A nonvolatile semiconductor memory device comprising:
- a plurality of memory cells which are arranged in a matrix form having rows and columns, each including a control gate, a floating gate, a source and a drain, and holding an information charge in said floating gate;
- a plurality of bit lines each of which correspond to a column of said memory cells, and connect to the drains of said memory cells in the corresponding column;
- a plurality of word lines which extend in a direction crossing said bit lines, each of said plurality of word lines correspond to a row of said memory cells, and connect to the control gates of said memory cells in the corresponding row;
- a plurality of source lines each of which correspond to a row of said memory cells, and connect to the sources of said memory cells in the corresponding row;

erasing means which applies a negative high voltage to a selected word line in an erasing operation; and voltage applying means which applies a positive voltage to a substrate region, in which the corresponding memory cell is formed, for a predetermined period of time after application of a negative high voltage to a selected word line in said erasing operation by said erasing means.

14. A nonvolatile semiconductor memory device according to claim 13, wherein said substrate region includes a source and a drain.

15. A nonvolatile semiconductor memory device according to claim 13, wherein said substrate region includes a semiconductor substrate in which said memory cells are formed.

16. A method for erasing an information charge of nonvolatile semiconductor memory device having a plurality of memory cells, which are arranged in a matrix form having rows and columns, each including a control gate, a floating gate, a sources and a drain, and holding said information charge in said floating gate, comprising the steps of:

selecting a word line connected to the control gate of the memory cell to be erased; and applying a high negative voltage to said selected word line, applying a positive voltage to the source of the corresponding individual memory cell and applying a positive voltage to the unselected word lines; and grounding simultaneously a bit line and a source line connected to the drain and the source of the individual memory cell, respectively.

17. A method for erasing an information charge of selected portion of a nonvolatile semiconductor memory device having a plurality of memory cells, which are arranged in a matrix form having rows and columns, each including a control gate, a floating gate, a sources and drain, and holding said information charge in said floating gate, comprising the steps of:

selecting a word line connected to the control gate of a selected memory cell to be erased;

applying a high negative voltage to said selected word line to erase the information charge of the selected memory cell; and applying a positive voltage to a substrate region, in which the memory cell to be erased is formed, for a predetermined period of time so as to erase the information charge in the selected memory cell.

18. An electrically writable and erasable nonvolatile semiconductor memory device of a flash type comprising:

a plurality of memory cells which are arranged in a matrix form having rows and columns, each including a control gate, a floating gate, a source and a drain, and holding an information charge in said floating gate;

a plurality of bit lines each of which correspond to a column of said memory cells, and connect to the drains of said memory cells in the corresponding column;

a plurality of word lines which extend in a direction crossing said bit lines, each of said plurality of word lines correspond to a row of said memory cells, and connect to the control gates of said memory cells in the corresponding row;

a plurality of source lines each of which correspond to a row of said memory cells, and connect to the sources of said memory cells in the corresponding row;

a write/read row decoder connected to each of said word lines, for applying a positive-voltage/supply-voltage to a selected word line in response to a signal for selecting one of said word lines in writing/reading operations;

an erase row decoder connected to each of said word lines, for applying a negative voltage to a selected word line in response to a signal for selecting one of said word lines in an erasing operation; and a source line switch for grounding the source line connected to the source of a memory cell connecting to a selected word line when said erase row decoder is activated.

19. In a semiconductor memory device comprising a plurality of memory cells arranged in a matrix having rows and columns, each of said memory cells including a control gate, floating gate, source, drain, and holding an information charge in said floating gate; a plurality of bit lines each of which correspond to a column of said memory cells, and connect to the drains of said memory cells in the corresponding column; a plurality of word lines which extend in a direction crossing said bit lines, each of said plurality of word lines correspond to a row of said memory cells, and connect to the control gates of said memory cells in the corresponding row; a plurality of source lines each of which correspond to a row of said memory cells, and connect to the sources of said memory cells in the corresponding row; high voltage generating means connected to each of said word lines and having a capacitor; and erasing means, coupled to said high voltage generating means, said plurality of word lines and plurality of source lines, a method of selectively erasing a selected portion of said plurality of memory cells, comprising the steps of:

generating a signal for selecting at least one of said plurality of word lines and at least one of said plurality of source lines corresponding to a selected at least one of said plurality of memory cells to be erased, applying a predetermined clock signal to said capacitor in said high voltage generating means in response to said signal for selecting at least one of said plurality word lines, generating a negative high voltage in said high voltage generating means, applying, with said erasing means, said negative high voltage generated by said high voltage generating means to the at least one word line selected by said selection signal, and grounding, with said erasing means, the at least one source line selected by said selection signal so as to erase the information charge held in the floating gate of the selected memory cell.

20. In a semiconductor memory device comprising a plurality of memory cells arranged in a matrix having rows and columns, each of said memory cells including a control gate, floating gate, source, drain, and holding an information charge in said floating gate; a plurality of bit lines each of which correspond to a column of said memory cells, and connect to the drains of said memory cells in the corresponding column; a plurality of word lines which extend in a direction crossing said bit lines, each of said plurality of word lines correspond to a row of said memory cells, and connect to the control gates of said memory cells in the corresponding row; a plurality of source lines each of which correspond to a row of said memory cells, and connect to the sources of said memory cells in the corresponding row; high voltage generating means connected to each of said word lines and having a capacitor; and erasing means, coupled to said high voltage generating means, said plurality of word lines and plurality of source lines, a method of selectively erasing a selected portion of said plurality of memory cells, comprising the steps of:

generating a signal for selecting at least one of said plurality of word lines and at least one of said plurality of source lines corresponding to a selected at least one of said plurality of memory cells to be erased, applying a predetermined clock signal to said capacitor in said high voltage generating means in response to said signal for selecting at least one of said plurality word lines, generating a negative high voltage in said high voltage generating means, applying, with said erasing means, said negative high voltage generated by said high voltage generating means to the at least one word line selected by said selection signal, and applying, with said erasing means, a positive voltage to the at least one source line selected by said selection signal so as to erase the information charge held in the floating gate of the selected memory cell.

21. In a semiconductor memory device comprising a plurality of memory cells arranged in a matrix having rows and columns, each of said memory cells including a control gate, floating gate, source, drain, and holding an information charge in said floating gate; a plurality of bit lines each of which correspond to a column of said memory cells, and connect to the drains of said memory cells in the corresponding column; a plurality of word lines which extend in a direction crossing said bit lines, each of said plurality of word lines correspond to a row of said memory cells, and connect to the control gates of said memory cells in the corresponding row; a plurality of source lines each of which correspond to a row of said memory cells, and connect to the sources of said memory cells in the corresponding row; a plurality of row decoder means each provided corresponding to each of said word lines; and a plurality of high voltage providing means each provided between each of said row decoding means and each of said word lines, comprising first and second transistors of a first conductivity type connected together in series, and a third transistor of a second conductivity type connected in series with said first and second transistors, a corresponding one of said word lines being connected to a connecting part therefor, a method of selectively erasing a selected portion of said plurality of memory cells, comprising the steps of:

generating a signal for selecting at least one of said plurality of word lines and at least one of said plurality of source lines corresponding to a selected at least one of said plurality of memory cells to be erased, generating a signal of a logical high level in said row decoder means in response to a signal for selecting one of said word lines, providing with an output signal of said row decoding means to the gates of each of said first and second transistors, providing a power supply potential to the opposite side of said connecting part of said first transistor, providing a ground voltage to the opposite side of said connecting part of said second transistor, and providing a negative voltage to the gate of said third transistor.

22. In a semiconductor memory device comprising a plurality of memory cells arranged in a matrix having rows and columns, each of said memory cells including a control gate, floating gate, source, drain, and holding an information charge in said floating gate; a plurality of bit lines each of which correspond to a column of said memory cells, and connect to the drains of said memory cells in the corresponding column; a plurality of word lines which extend in a direction crossing said bit lines, each of said plurality of word lines correspond to a row of said memory cells, and connect to the control gates of said memory cells in the corresponding row; a plurality of source lines each of which correspond to a row of said memory cells, and connect to the sources of said memory cells in the corresponding row; high voltage generating means connected to each of said word lines and having a capacitor; and erasing means, coupled to said high voltage generating means, said plurality of word lines and plurality of source lines, a method of selectively erasing a selected portion of said plurality of memory cells, comprising the steps of:

generating a signal for selecting at least one of said plurality of word lines and at least one of said plurality of source lines corresponding to a selected at least one of said plurality of memory cells to be erased, applying a predetermined clock signal to said capacitor in said high voltage generating means in response to said signal for selecting at least one of said plurality word lines, generating a negative high voltage in said high voltage generating means, applying, in an erasing step, with said erasing means said negative high voltage generated by said high voltage generating means to said selected at least one of said plurality of word lines, a positive voltage to the selected at least one of said plurality of source lines, and a positive voltage to unselected word lines, and simultaneously grounding said bit lines and said source lines after completion of said erasing step by said erasing means.

23. In a semiconductor memory device comprising a plurality of memory cells arranged in a matrix having rows and columns, each of said memory cells including a control gate, floating gate, source, drain, and holding an information charge in said floating gate; a plurality of bit lines each of which correspond to a column of said memory cells, and connect to the drains of said memory cells in the corresponding column; a plurality of word lines which extend in a direction crossing said bit lines, each of said plurality of word lines correspond to a row of said memory cells, and connect to the control gates of said memory cells in the corresponding row; a plurality of source lines each of which correspond to a row of said memory cells, and connect to the sources of said memory cells in the corresponding row; high voltage generating means connected to each of said word lines and having a capacitor; and erasing means, coupled to said high voltage generating means, said plurality of word lines and plurality of source lines, a method of selectively erasing a selected portion of said plurality of memory cells, comprising the steps of:

generating a signal for selecting at least one of said plurality of word lines and at least one of said plurality of source lines corresponding to a selected at least one of said plurality of memory cells to be erased, applying a predetermined clock signal to said capacitor in said high voltage generating means in response to said signal for selecting at least one of said plurality word lines, generating a negative high voltage in said high voltage generating means, applying, with said erasing means, said negative high voltage generated by said high voltage generating means to the at least one word line selected by said selection signal, and applying a positive voltage to a substrate region, in which a selected memory cell is formed, for a predetermined period of time after application of a negative high voltage to a selected word line.

24. In an electrically writable and erasable nonvolatile semiconductor memory device of a flash type comprising a plurality of memory cells arranged in a matrix having rows and columns, each of said memory cells including a control gate, floating gate, source, drain, and holding an information charge in said floating gate; a plurality of bit lines each of which correspond to a column of said memory cells, and connect to the drains of said memory cells in the corresponding column; a plurality of word lines which extend in a direction crossing said bit lines, each of said plurality of word lines correspond to a row of said memory cells, and connect to the control gates of said memory cells in the corresponding row; a plurality of source lines each of which correspond to a row of said memory cells, and connect to the sources of said memory cells in the corresponding row; a write/read row decoder connected to each of said word lines; an erase row decoder connected to each of said word lines; and a source line switch connected to ground and said plurality of source lines, a method of selectively erasing a selected portion of said plurality of memory cells, comprising the steps of:

generating a signal for selecting at least one of said plurality of word lines and at least one of said plurality of source lines corresponding to a selected at least one of said plurality of memory cells to be erased, applying, with said write/read row decoder, a positive-voltage/supply-voltage to a selected word line in response to a signal for selecting one of said word lines in writing/reading operations, applying, with said erase row decoder, a negative voltage to a selected word line in response to a signal for selecting one of said word lines in an erasing operation, and grounding, with said source line switch, the selected at least one of said plurality of source lines when said erase row decoder is activated.

* * * * *